(12) United States Patent
Dabral

(10) Patent No.: US 9,509,490 B1
(45) Date of Patent: Nov. 29, 2016

(54) REFERENCE CLOCK SHARING

(71) Applicant: Apple Inc., Cupertino, CA (US)

(72) Inventor: Sanjay Dabral, Cupertino, CA (US)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 14/859,757

(22) Filed: Sep. 21, 2015

(51) Int. Cl.
H04L 25/49 (2006.01)
H04L 25/40 (2006.01)
H03D 3/24 (2006.01)
H04L 7/033 (2006.01)
H03L 7/099 (2006.01)

(52) U.S. Cl.
CPC ............ H04L 7/0331 (2013.01); H03L 7/099 (2013.01)

(58) Field of Classification Search
USPC ............... 375/219, 220, 222, 229–236, 240, 375/240.26–240.29, 259, 278, 269, 285, 375/284, 286, 294, 295, 296, 297, 316, 324, 375/325, 327, 350, 346, 347, 348, 343, 354, 375/373–376, 371, 362
See application file for complete search history.

(56) References Cited

U.S. PATENT DOCUMENTS

| | | | | |
|---|---|---|---|---|
| 4,988,955 A * | 1/1991 | Horie | ........................ | G06F 1/08 331/11 |
| 6,631,144 B1 * | 10/2003 | Johansen | .................. | H03L 7/07 370/516 |
| 7,683,691 B2 | 3/2010 | Kumata | | |
| 9,201,165 B2 * | 12/2015 | Tsai | ........................ | G02B 1/00 |
| 2005/0141636 A1 * | 6/2005 | Minami | ............... | H03C 3/0958 375/295 |
| 2006/0139103 A1 * | 6/2006 | Beeson | ................... | H03L 7/081 331/16 |
| 2008/0175344 A1 * | 7/2008 | Menolfi | .................... | H03L 7/07 375/376 |
| 2008/0292040 A1 * | 11/2008 | Menolfi | ................. | H03D 3/006 375/376 |
| 2009/0059324 A1 * | 3/2009 | Nagase | .................. | H04N 1/028 358/513 |
| 2009/0257542 A1 * | 10/2009 | Evans | ...................... | H03L 7/07 375/375 |
| 2009/0261876 A1 * | 10/2009 | Zhan | ...................... | H03L 7/099 327/157 |
| 2009/0279642 A1 * | 11/2009 | Zarei | ..................... | H03D 3/006 375/327 |
| 2009/0304118 A1 * | 12/2009 | Yuanzhu | ............. | H04B 7/0854 375/340 |

(Continued)

OTHER PUBLICATIONS

"AN562—PCI Express 3.0 Jitter Requirements"—Silicon Labs, pp. 1-24, Rev. 0.1 Dec. 2010, https://www.silabs.com/support/pages/contacttechnicalsupport.aspx.

(Continued)

*Primary Examiner* — Linda Wong
(74) *Attorney, Agent, or Firm* — Meyertons, Hood, Kivlin, Kowert & Goetzel, P.C.

(57) ABSTRACT

A system for sharing a reference clock signal between multiple devices is disclosed. The system includes a source device, and a plurality of destination devices. The source device may be configured to generate a reference clock signal and transmit data via a communication link. The reference clock signal may include first and second phases, and the second phase may be an inverse of the first phase. A filter unit configured to filter the reference clock signal may be coupled between the first and second phases of the reference clock signal. Each destination device may be configured to receive the reference clock signal and receive the data dependent upon the reference clock signal.

17 Claims, 8 Drawing Sheets

(56) References Cited

U.S. PATENT DOCUMENTS

| | | | | |
|---|---|---|---|---|
| 2010/0148829 A1* | 6/2010 | Hong | G09G 3/3648 | 327/108 |
| 2011/0115536 A1* | 5/2011 | Agarwal | H03L 7/0816 | 327/158 |
| 2011/0316596 A1* | 12/2011 | Schultz | H04L 7/0337 | 327/156 |
| 2012/0188107 A1* | 7/2012 | Ashburn, Jr. | H03M 3/344 | 341/110 |
| 2012/0214433 A1* | 8/2012 | Shimizu | H03F 1/223 | 455/127.2 |
| 2014/0015615 A1* | 1/2014 | Hekmat | H03L 7/06 | 331/2 |
| 2014/0211899 A1* | 7/2014 | Furudate | H03L 7/08 | 375/376 |
| 2014/0218082 A1* | 8/2014 | Fan | H03H 19/004 | 327/157 |
| 2015/0042365 A1* | 2/2015 | Tsai | G02B 1/00 | 324/681 |
| 2015/0222273 A1* | 8/2015 | Allan | H03L 7/08 | 327/157 |

OTHER PUBLICATIONS

"Si5335—Web-Customizable, Any-Frequency, Any-Output Quad Clock Generator/Buffer"—Silicon Labs, pp. 1-47, Rev. 1.3, https://www.silabs.com/support/pages/contacttechnicalsupport.aspx.

* cited by examiner

REFERENCE CLOCK SHARING

BACKGROUND

Technical Field

Embodiments described herein relate to integrated circuits, and more particularly, to techniques for generating clock signals.

Description of the Related Art

A variety of electronic devices are now in daily use with consumers. Particularly, mobile devices have become ubiquitous. Mobile devices may include cell phones, personal digital assistants (PDAs), smart phones that combine phone functionality and other computing functionality such as various PDA functionality and/or general application support, tablets, laptops, net tops, smart watches, wearable electronics, etc.

Such mobile devices, or computing systems, in general, may include multiple integrated circuits, each performing different tasks. In some cases, one integrated circuit may transmit or send data to another integrated circuit within the mobile device or computing system. Such data may be transmitted in accordance with one of various techniques. For example, data may be transmitted in a serial or parallel fashion. Some serial transmission techniques may not make use of a clock signal to synchronize the transmission of the data between the source and destination integrated circuits.

High frequency noise on the power supplies may be created by the power supply and regulation circuits and may affect the performance of the functional units within an integrated circuit. In some cases, one functional unit may create noise on a power supply that may affect the operation of other functional units. Power supplies coupled to circuits or functional units particularly affected by power supply noise may be filtered in order to mitigate the effects of the power supply noise. In some cases, power supply noise may couple to reference clocks shared between multiple functional units within a computing system, resulting in undesirable jitter and variations in clock timing between the various functional units.

SUMMARY OF THE EMBODIMENTS

Various embodiments of an apparatus for generating a shared reference clock signal are disclosed. Broadly speaking, an apparatus is contemplated in which a Phase-Locked Loop (PLL) is configured to generate a source clock signal. A buffer unit may be configured to generate a reference clock signal that includes two phases, wherein one phase is the inverse of the other. A filter unit may be configured to filter the reference clock signal.

In one embodiment, the filter unit may include at least one capacitor and at least one inductor. Each of the at least one capacitor and the at least one inductor may be coupled, in parallel, between the phases of the reference clock signal.

In a further embodiment, the apparatus further includes a transmit unit. The transmit unit may be configured to transmit data via a communication link to at least one of multiple destination devices.

BRIEF DESCRIPTION OF THE DRAWINGS

The following detailed description makes reference to the accompanying drawings, which are now briefly described.

Figure 1:
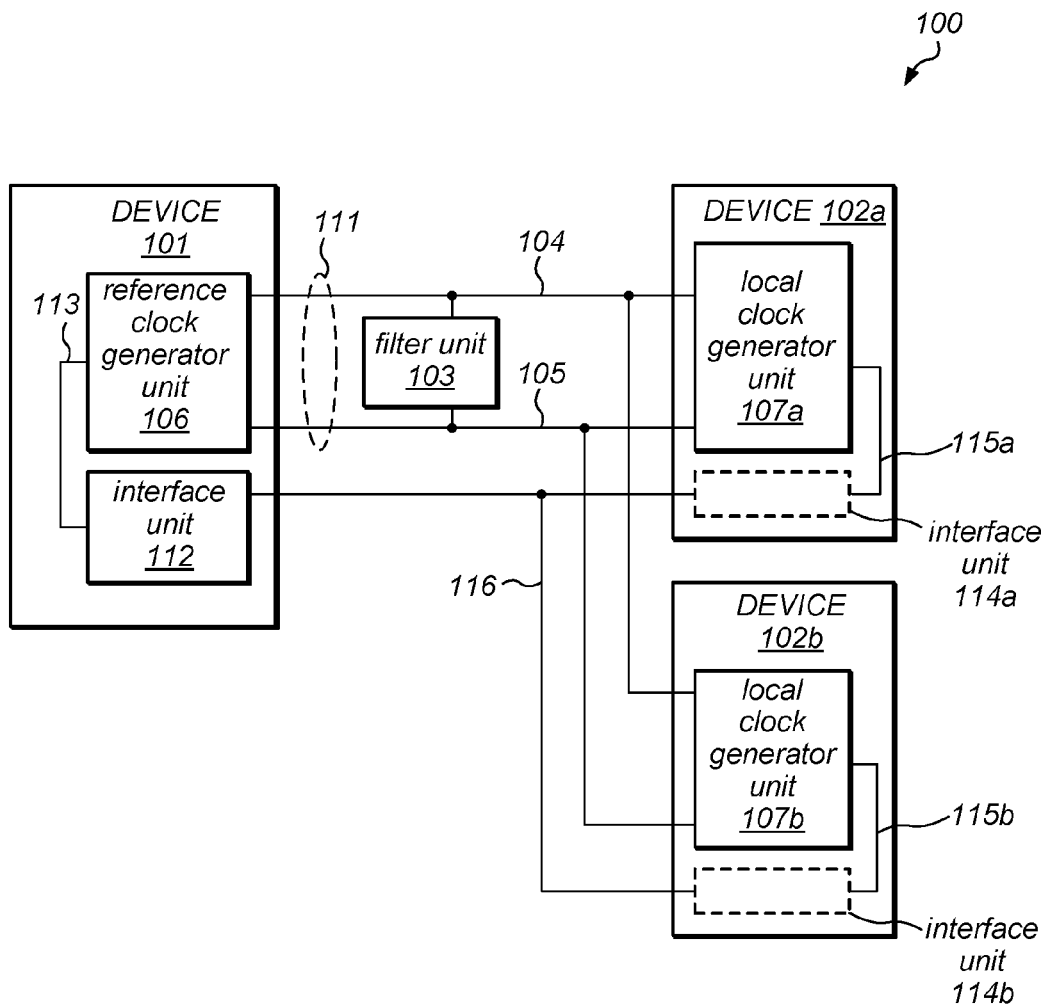
FIG. 1 illustrates an embodiment of computing system.

While the disclosure is susceptible to various modifications and alternative forms, specific embodiments thereof are shown by way of example in the drawings and will herein be described in detail. It should be understood, however, that the drawings and detailed description thereto are not intended to limit the disclosure to the particular form illustrated, but on the contrary, the intention is to cover all modifications, equivalents and alternatives falling within the spirit and scope of the present disclosure as defined by the appended claims. The headings used herein are for organizational purposes only and are not meant to be used to limit the scope of the description. As used throughout this application, the word "may" is used in a permissive sense (i.e., meaning having the potential to), rather than the mandatory sense (i.e., meaning must). Similarly, the words "include," "including," and "includes" mean including, but not limited to.

Various units, circuits, or other components may be described as "configured to" perform a task or tasks. In such contexts, "configured to" is a broad recitation of structure generally meaning "having circuitry that" performs the task or tasks during operation. As such, the unit/circuit/component can be configured to perform the task even when the unit/circuit/component is not currently on. In general, the circuitry that forms the structure corresponding to "configured to" may include hardware circuits. Similarly, various units/circuits/components may be described as performing a task or tasks, for convenience in the description. Such descriptions should be interpreted as including the phrase "configured to." Reciting a unit/circuit/component that is configured to perform one or more tasks is expressly intended not to invoke 35 U.S.C. §112, paragraph (f) interpretation for that unit/circuit/component. More generally, the recitation of any element is expressly intended not to invoke 35 U.S.C. §112, paragraph (f) interpretation for that element unless the language "means for" or "step for" is specifically recited.

DETAILED DESCRIPTION OF EMBODIMENTS

In a computing system that includes multiple devices (also referred to herein as "functional units"), individual devices may need to send requests and receive responses (collectively "transactions") from other devices. As used and described herein, a device may be a single integrated circuit, or multiple integrated circuits mounted together in a single integrated circuit package. The transmission of transactions may be accomplished through the used of a communication bus coupled between the devices. Requests and responses transmitted via the communication bus may be encoded in accordance with one of various industry standard communication protocols, such as, Peripheral Component Interface Express (PCIe), for example.

Such communication protocols may include the use of a reference clock signals transmitted between the devices. In some computing systems, a single device may be used to generate multiple versions of the reference clock signals, one for each device in the computing system. In such cases, a signal from an oscillator is buffered through multiple instances of buffer circuits to drive the reference clock signals to each device. In addition to multiple buffer circuits, multiple sets of physical terminals (commonly referred to as "bumps"), as well as multiple sets of wires between the devices, are used to distribute the multiple reference clock signals to their respective devices.

Each instance of a buffer circuit consumes area on device generating the reference clock signals. In addition to the area, each instance of a buffer circuit consumes power. Moreover, the additional bumps may also increase silicon chip size, and the wiring for the multiple reference clock signals may increase area on a circuit board, substrate, or other suitable medium for mounting multiple devices. The embodiments illustrated in the drawings and described below may provide techniques for sharing a reference clock signal thereby reducing power consumption and area.

A block diagram of a computing system is illustrated in FIG. 1. In various embodiments, computing system 100 may be configured for use in a desktop computer, server, or in a mobile computing application such as, e.g., a tablet or laptop computer. In the illustrated embodiment, computing system 100 includes devices 101, 102a, and 102b. Device 101 includes reference clock generator unit 106, and devices 102a and 102b include local clock generator units 107a and 107b, respectively. Reference clock generator unit 106 generates two phases, 104 and 105, of reference clock 111, which is transmitted to each of devices 102a and 102b. Filter unit 103 is coupled between reference clock phases 104 and 105. As described below in more detail, filter unit 103 may include a combination of inductor, capacitors, and other passive elements, arranged to filter reference clock signal 111.

Clock phases 104 and 105 are coupled to each of devices local clock generator units 107a and 107b, which, are each configured to generate local clock signals 115a and 115b. Alternatively, or additionally, local clock generator units 107a and 107b may generate internal clocks at different frequencies for use within devices 102a and 102b, respectively.

Device 101 also includes interface unit 112 coupled to communication bus 116. Interface unit 112 may, in various embodiments, be configured to send requests and receive responses via communication bus (or "link") 116 using local clock signal 113. In various embodiments, communication between devices that is transmitted across communication bus 116 may conform to one of various industry standard communication protocols, such as, PCIe, for example. Communication from interface unit 112 may be received by interface units 114a and 114b included in devices 102a and 102b, respectively. Interface units 114a and 114b may each be configured to receive requests via communication bus 116 using local clock signals 115a and 115b, respectively. It is noted that, in some embodiments, interface units 114a and/or 114b are optional, and that communication between devices may be handled in any other suitable manner.

In some embodiments, device 101 may be representative of a general-purpose processor that performs computational operations. For example, device 101 may be a central processing unit (CPU) such as a microprocessor, a microcontroller, an application-specific integrated circuit (ASIC), or a field-programmable gate array (FPGA). Device 101 may retrieve program instructions from a memory or other suitable storage device (not shown). For example, devices 102a and 102b may include any suitable type of memory such as a Dynamic Random Access Memory (DRAM), a Static Random Access Memory (SRAM), a Read-only Memory (ROM), Electrically Erasable Programmable Read-only Memory (EEPROM), or a non-volatile memory, for example.

Either of devices 102a or 102b may include analog/mixed-signal circuits including, for example, a crystal oscillator, a phase-locked loop (PLL), an analog-to-digital converter (ADC), and a digital-to-analog converter (DAC) (all not shown). In other embodiments, such analog/mixed-signal circuits may be configured to perform power management tasks with the inclusion of on-chip power supplies and voltage regulators. Such analog/mixed-signal circuits may also include, in some embodiments, radio frequency (RF) circuits that may be configured for operation with wireless networks.

In various embodiments, devices 102a and 102b may include circuits dedicated for input/output (I/O) between computing system 100 and one or more peripheral devices. Such peripheral devices may include, without limitation, storage devices (e.g., magnetic or optical media-based storage devices including hard drives, tape drives, CD drives, DVD drives, etc.), audio processing subsystems, or any other suitable type of peripheral devices. In some embodiments, I/O block 104 may be configured to implement a version of Universal Serial Bus (USB) protocol or IEEE 1394 (Firewire®) protocol.

Such I/O circuits may also be configured to coordinate data transfer between computing system 100 and one or more devices (e.g., other computer systems or integrated circuits) coupled to computing system 100 via a network. In one embodiment, I/O circuits may be configured to perform the data processing necessary to implement an Ethernet (IEEE 802.3) networking standard such as Gigabit Ethernet or 10-Gigabit Ethernet, for example, although it is contemplated that any suitable networking standard may be implemented.

In some embodiments, each of the aforementioned functional units may include multiple circuits, each of which may include multiple devices, such as, e.g., metal-oxide semiconductor field-effect transistors (MOSFETs) connected via multiple wires fabricated on multiple conductive layers. The conductive layers may be interspersed with insulating layers, such as, silicon dioxide, for example. Each circuit may also contain wiring, fabricated on the conductive layers, designated for a power supply net or a ground supply net.

It is noted that the embodiment depicted in FIG. 1 is merely an example. In other embodiments, different numbers and types of devices may be employed.

Figure 2:
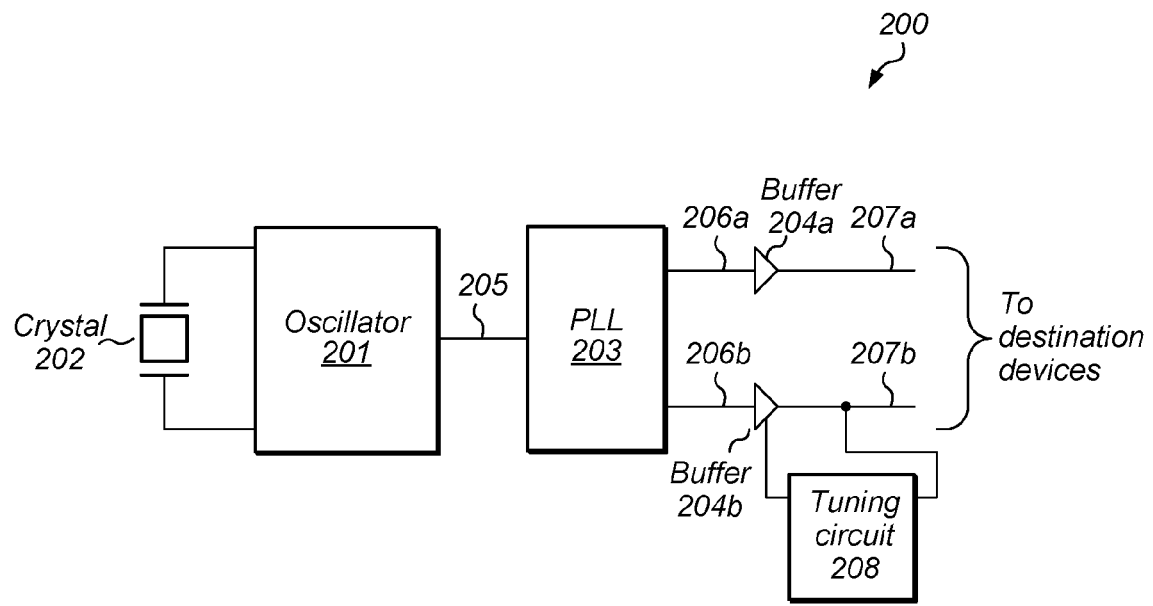
FIG. 2 illustrates an embodiment of a reference clock generator unit.

Moving to FIG. 2, an embodiment of a reference clock generator unit is illustrated. In various embodiments, reference clock generator unit 200 may correspond to reference clock generator unit 106 as depicted in FIG. 1. In the illustrated embodiment, reference clock generator 200 includes oscillator 201, phase-locked loop (PLL) 203, buffers 204a and 204b, and tuning circuit 208.

Crystal 202 is coupled to oscillator 201. In various embodiments, crystal 202 may be a type of piezoelectric resonator that may be fabricated from quartz, polycrystalline ceramic, or any other suitable material. It is noted that although oscillator 201 is depicted as using a crystal, it other embodiments, any suitable oscillator circuit may be employed including oscillator circuits that do not employ a crystal.

Oscillator 201 may, in various embodiments, be configured to generate source clock signal 205. In order to generate source clock signal 205, oscillator 201 may be configured to amplify a voltage signal from crystal 202, and then feed the amplified voltage signal back onto the crystal. A frequency of source clock signal may be a function of one or more physical parameters of crystal 202.

PLL 203 may be configured to use source clock signal 205 as reference to generate signals 206a and 206b. In various embodiments, signals 206a and 206b may be inverses of each other. PLL 203 may, in some embodiments, employ one or more frequency dividers in order to allow the frequencies of signals 206a and 206b to be different than the frequency of source clock signal 205. Although the embodiment illustrated in FIG. 2 depicts the use of a PLL, in other embodiments, any other suitable phase or frequency lock circuits, such as, e.g., a delay-locked loop (DLL) may be employed.

Signals 206a and 206b are coupled to the inputs of buffers 204a and 204b, respectively. The output of buffers 204a and 204b are, in turn, coupled to signals 207a and 207b, respectively. In various embodiments, signals 207a and 207b may correspond to reference clock phases 104 and 105 as illustrated in FIG. 1. Buffers 204a and 204b may be configured to drive a load coupled to each of signals 207a and 207b. As used and described herein, a buffer is a particular embodiment of a non-inverting amplifier that may be designed in accordance with one of various design styles. For example, in some embodiments, a buffer may include a complementary pair of transistors arranged as a push-pull amplifier. A buffer may, in various embodiments, include protection circuitry to prevent damage by electrostatic discharge (ESD) events that may occur during assembly or operation of the system.

In some embodiments, a drive capability of buffers 204a and 204b may be limited dependent upon voltage levels of signals 207a and 207b respectively. Dependent upon the quality of components used in the filter unit, such as, e.g., filter unit 103, and the frequency of signals 207a and 207b, large voltage swings on signals 207a and 207b may occur during resonance. To monitor the voltage swings, tuning circuit 208 may sample a voltage level of signal 207b and generate control signal 209. Buffer 204b may, in response to control signal 209, decrease an amount of current sourced or sunk, and/or a duration of operation, in order to maintain voltage levels on signal 207b between upper and lower bounds. In some embodiments, the upper and lower bounds may be programmable based on desired performance levels of the computing system. Additionally, or alternatively, tuning circuit 208 may detect a DC offset of signal 207b and adjust control signal 209 such that buffer 204b may maintain the DC offset of signal 207b at a desired level. Although only one tuning circuit and associated control signal is depicted in the present embodiment, in other embodiments, any suitable number of tuning circuits and control signals may be employed.

It is noted that the embodiment depicted in FIG. 2 is merely an example. In other embodiments, different functional units, and different arrangements of functional units are possible and contemplated.

Figure 3:
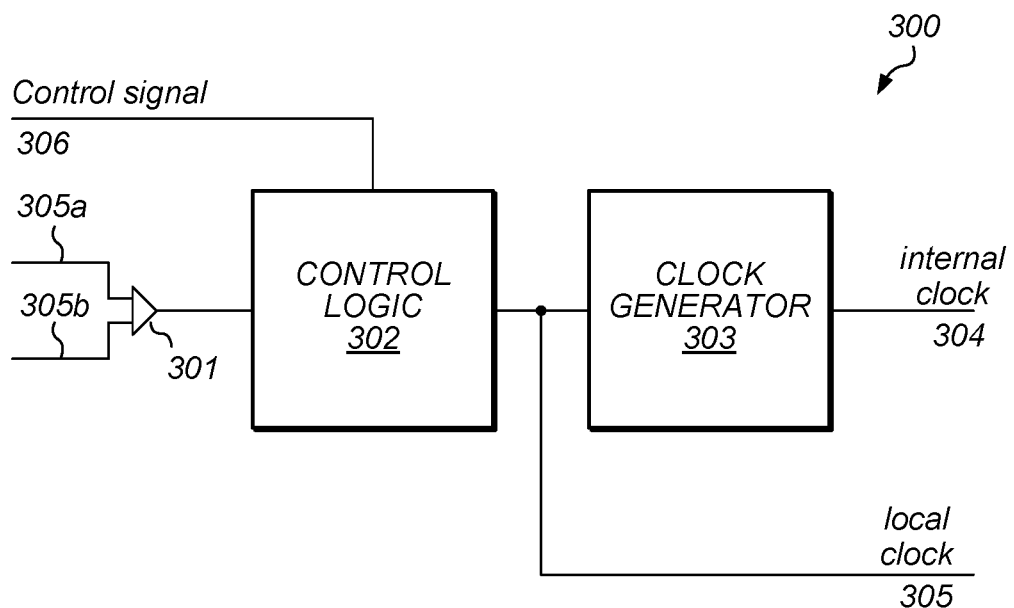
FIG. 3 illustrates an embodiment of a local clock generator unit.

Turning to FIG. 3, an embodiment of a local clock generator unit is illustrated. Local clock generator unit 300 may, in various embodiments, correspond to either of local clock generators 107a and 107b as illustrated in FIG. 1. In the illustrated embodiment, internal clock generator unit 300 includes receiver 301, control logic 302, and clock generator 303.

Input signals 305a and 305b are coupled to the input of receiver 301. In various embodiments, input signals 305a and 305b may correspond to reference clock phases 104 and 105 of FIG. 1, respectively. The output of receiver 301 is couple to control logic 302, which is additionally coupled to control signal 306. The output of control logic 302, namely local clock 305, is coupled to internal clock generator 303, which generates internal clock 304.

During operation, receiver 301 may amplify a difference in voltage levels between input signals 305a and 305b, and generate an output signal whose voltage level is proportional the difference in voltage levels. In various embodiments, receiver 301 may employ a matched pair of metal-oxide semiconductor field-effect transistors (MOSFETs) to amplify the difference in the voltage levels between the two input signals. It is noted, however, that any suitable circuit, including circuits fabricated on technologies other than a complementary metal-oxide semiconductor (CMOS) technology may be employed. Although receiver 301 is depicted in the present embodiment as amplifying a different between signals 305a and 305b, in other embodiments, receiver 301 may receive and amplify a single signal, separately amplify multiple signals, or any other suitable receiving scheme for the reference clock signals.

Dependent upon a state of control signal 306, control logic 302 may stop or "gate" the output receiver 301 rendering local clock 305 inactive. In various embodiments, a design of some functional units, such as, e.g., functional units associated with the physical layer of a communication protocol, may not support a clock signal that is always active. In such cases, a control circuit, such as, e.g., control logic 302 may be used to disable a local version of the reference clock in accordance with design parameters of the functional units. It is noted that, in various embodiments, control logic 302 may not be employed, and the output of receiver 301 may be used directly as local clock 305.

Internal clock generator 303 may be configured to generator internal clock 304. In some embodiments, internal clock generator 303 may employ a PLL (not shown) to maintain a phase relationship between internal clock 304 and inputs signals 305a-b. A frequency of internal clock 304 may be substantially the same, higher, or lower, than frequencies of inputs signals 305a-b. Internal generator 303 may also include one or more buffers that may be employed to drive an internal clock wiring network within a device, such as, device 102a as illustrated in FIG. 1, for example. In some embodiments, simplified circuitry, i.e., no additional inductor, may be employed by internal clock generator 303 due to the use of a filter unit, such as, filter unit 103 as depicted in FIG. 1, for example.

It is noted that the embodiment illustrated in FIG. 3 is merely an example. In other embodiments, different functional units and different combinations of functional units may be employed.

Figure 4:
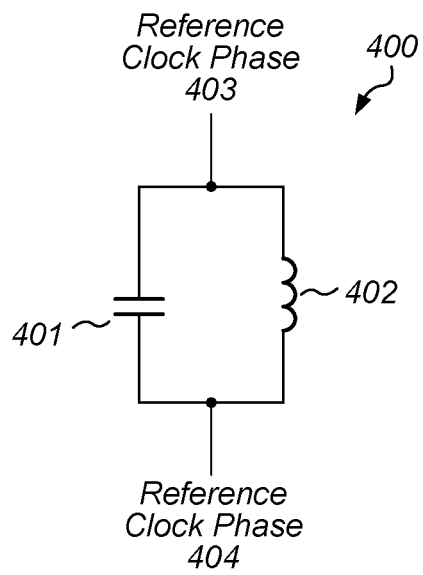
FIG. 4 illustrates an embodiment of a filter unit.

Turning to FIG. 4, an embodiment of a filter unit is illustrated. Filter unit 400 may, in various embodiments, correspond to filter unit 103 as illustrated in FIG. 1. In the illustrated embodiment, filter unit 400 includes capacitor 401 and inductor 402. Each terminal of each of capacitor 401 and inductor 402 is coupled to a respective one of reference clock phase 403 and reference clock phase 404. In various embodiments, reference clock phase 403 and reference clock phase 404 may correspond to reference clock phases 104 and 105, respectively. In various embodiments, reference clock phases 403 and 404 may be out of phase with each other. For example, in some embodiments, reference clock phase 404 may lag reference clock phase 403 by 108 degrees.

Capacitor 401 may, in various embodiments, include one or more discrete capacitors coupled to a substrate or other circuit board, to which devices, such as devices 101, and 102*a-b*, are mounted. In other embodiments, capacitor 401 may be fabricated on one or more of devices 101 and 102*a-b* using a semiconductor manufacturing process.

In a similar fashion to capacitor 401, inductor 402 may be either a discrete device mounted on a shared substrate or circuit board, or it may be fabricated on one of the devices included in the computing system. In some embodiments, metal wiring layers included in a given device of the devices included in the computing system may be arranged to provide a desired amount of inductance.

In other embodiments, inductor 402 may be fabricated on a separate chip or die from the devices of the computer system. The separate die may then be attached to one of the devices of the computing system during a package assembly process.

Figure 5:
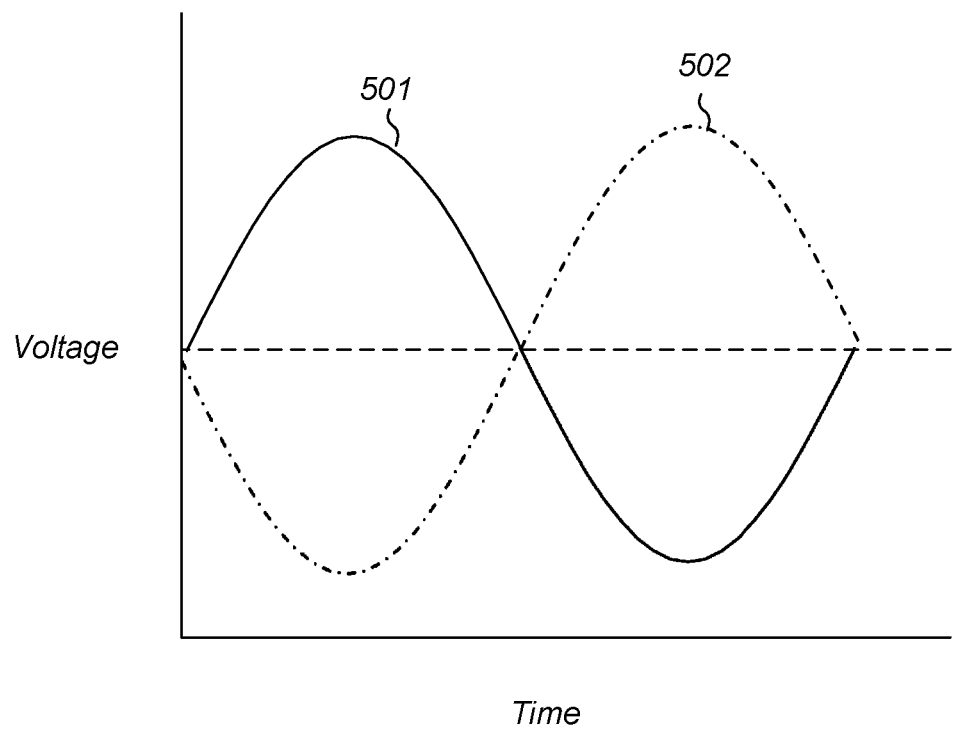
FIG. 5 depicts example reference clock waveforms.

During operation, capacitor 401 and inductor 402 may resonant at a frequency determined by their respective values. In some cases, the values of capacitor 401 and inductor 402 may be selected to resonant with a desired frequency of the reference clock signals. In such cases, energy may be exchanged between reference clock phase 403 and reference clock phase 404 through capacitor 401 and inductor 402. The voltage swing of each of reference clock phases 403 and 404 may be limited by the values of capacitor 401 and inductor 402. In some cases, as shown in FIG. 5, reference clock phases 403 and 404 may vary in a sinusoidal fashion whose amplitude is less than the original source clock. The reduced voltage swing of the reference clock phases may, in some embodiments, reduce power consumption of the output buffers, such as, buffers 204*a* and 204*b* as illustrated in FIG. 2, for example.

In some embodiments, values of capacitor 401 and inductor 402 may be selected such that the resonant frequency of filter unit 400 corresponds to a frequency of a reference clock, such as, reference clock 111 as illustrated in FIG. 1. Some computing systems allow for multiple clock frequencies for different performance levels. Additionally, or alternatively, a clock signal's frequency may be switched over a small range of difference frequencies to reduce peak-radiated energy from the computing system. In such cases, the component values of capacitor 401 and inductor 402 may be selected to intentionally reduce a quality level (commonly referred to as a "Q factor") of filter unit 400, thereby allowing the filter unit to operate over the intended range of frequencies.

It is noted that the embodiment illustrated in FIG. 4 is merely an example. In other embodiments, different numbers of inductors and capacitors, as well as different arrangements of the inductors and capacitors may be employed.

Moving to FIG. 5, example reference clocks waveforms are illustrated. As described above, a reference clock may include two phases. In the present example, the reference clock includes phases 501 and 502. Each of phases 501 and 502 are depicted are being sinusoidal resulting from the use of reactive components in the filter unit. It is noted, however, that in other embodiments, different waveforms shapes, frequencies, magnitudes, and the like, are possible and contemplated.

In some embodiments, a filter unit, such as, e.g., filter unit 400 as illustrated in FIG. 4, may filter noise from each of phases 501 and 502. Such filtering may reduce the transition times from low-to-high, and high-to-low, voltage levels of phases 501 and 502 (commonly referred to as "edge rates"). By reducing the edge rates of phases 501 and 502, the signals become more sinusoidal and allow for consistent clock waveforms at receivers of multiple functional units within a computing system.

In the present example, phase 502 is the inverse of phase 501. That is, phase 502 is out-of-phase from phase 501 by one-half period. Although a half-period shift is depicted in FIG. 5, in other embodiments, any suitable phase shift between the phases of the reference clock may be employed. It is also noted that both phase 501 and 502 are depicted as having a similar DC offset in the example illustrated in FIG. 5. In other embodiments, each of phases 501 and 502 may have different DC offsets.

Figure 6A:
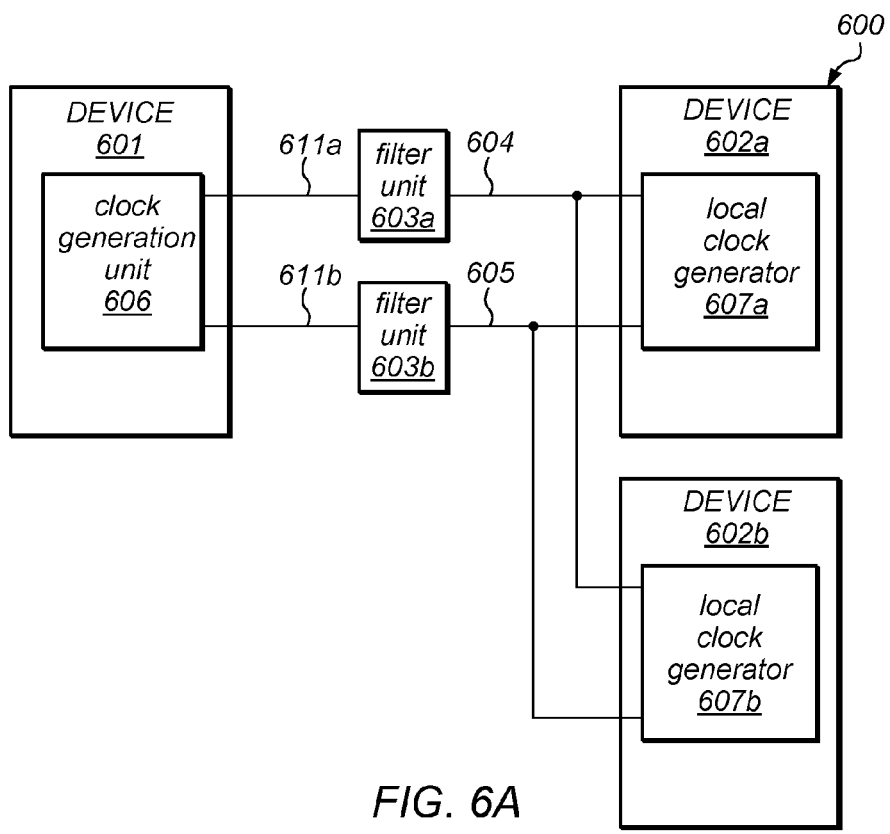
FIG. 6A illustrates another embodiment of a computing system.

Another embodiment of a computing system is depicted in FIG. 6A. In the illustrated embodiment, computing system 600 includes devices 601, 602*a*, and 602*b*. Device 601 includes clock generation unit 606, which is configured to generate reference clock phases 611*a* and 611*b*. In various embodiments, clock generation unit 606 may correspond to clock generator 200 as illustrated in FIG. 2. Reference clock 611 includes phases 604 and 605.

Filter units 603*a* and 603*b* are coupled in series with phases 604 and 605, respectively. As described below in more detail in reference to FIG. 7, each of filter units 603*a* and 603*b* may include a combination of inductors and capacitors configured to filter the phases of reference clock 611. In various embodiments, phases 604 and 605 may be in phase, or have a predetermined phase difference. Alternatively, or additionally, phases 604 and 605 may have differing DC offset voltage levels.

Devices 602*a* and 602*b* may, in various embodiments, correspond to any of a processor, memory, analog/mixed signal unit, or any other suitable functional unit or SoC. Device 602*a* includes local clock generator 607*a*, and device 602*b* includes local clock generator 607*b*. In various embodiments, each of local clock generators 607*a* and 607*b* may correspond to local clock generator 300 as depicted in FIG. 3. Local clock generators 607*a* and 607*b* may each be configured to generate a respective local and/or internal clock for use within devices 602*a* and 602*b*. In various embodiments, the generated local clocks may be used to send and receive communication packets between the various devices over a communication bus (not shown).

It is noted that the embodiment illustrated in FIG. 6 is merely an example. In other embodiments, different numbers and configurations of devices are possible and contemplated.

Figure 6B:
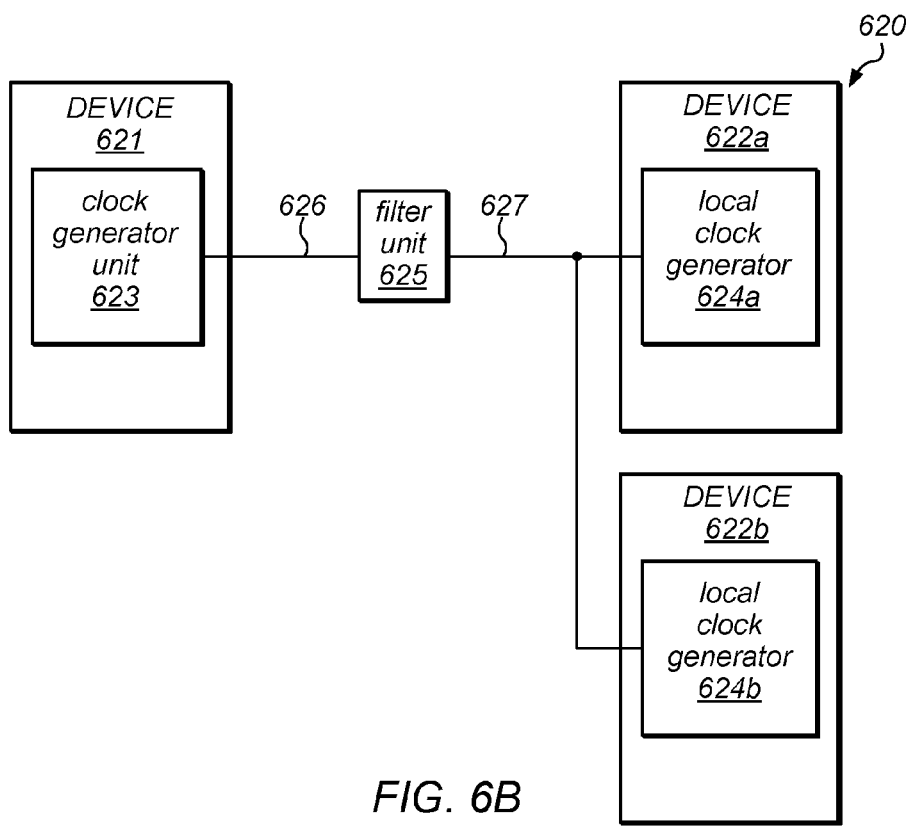
FIG. 6B illustrated another embodiment of a computing system.

Turning to FIG. 6B, another embodiment of a computing system is depicted. In the illustrated embodiment, computing system 620 includes devices 621, 622*a*, and 622*b*. Device 621 includes clock generation unit 623, which is configured to generate reference clock 626. In various embodiments, clock generation unit 623 may correspond to clock generator 200 as illustrated in FIG. 2.

Filter unit 625 coupled in series between reference clock 626 and signal 627. As described below in more detail in reference to FIG. 7, filter unit 625 may include a combination of inductors and capacitors configured to filter reference clock 626.

Devices 622*a* and 622*b* may, in various embodiments, correspond to any of a processor, memory, analog/mixed signal unit, or any other suitable functional unit or SoC. Device 622*a* includes local clock generator 624*a*, and device 622*b* includes local clock generator 624*b*. In various embodiments, each of local clock generators 624*a* and 624*b* may correspond to local clock generator 300 as depicted in FIG. 3. Local clock generators 624*a* and 624*b* may each be configured to generate a respective local and/or internal clock for use within devices 622a and 622b.

The embodiment of a computing system illustrated in FIG. 6B is merely an example. In other embodiments, different numbers of devices, and different arrangements of devices may be employed.

Figure 7:
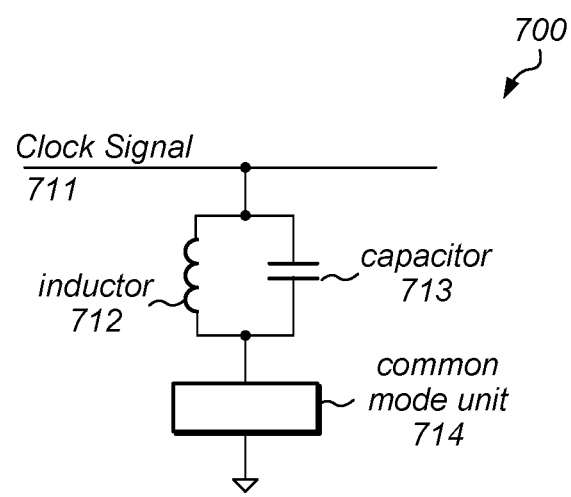
FIG. 7 illustrates an embodiment of a filter unit.

An embodiment of a filter unit is illustrated in FIG. 7. In the illustrated embodiment, filter unit 700 includes inductor 712, capacitor 713, and common mode unit 714. Inductor 712 and capacitor are coupled together, in parallel, and between clock signal 711 and common mode unit 714. Common mode unit 714 is further coupled to a ground node.

During operation, the parallel combination of inductor 712 and capacitor 713 provide a low impedance path from clock signal 711 to common mode unit 714. This low impedance path may result in a reduction of undesired frequencies present on clock signal 711. In various embodiments, component values for inductor 712 and capacitor 713 may be selected based on estimated frequencies of noise signals present on a reference clock signal, such as, e.g., clock signal 711, to which filter unit 700 is coupled. The component values for inductor 712 and 713 may also be selected to allow for variation in the intended frequency of clock signal 711.

Common mode unit 714 may, in various embodiments, provide a voltage level to terminals of inductor 712 and capacitor 713. In some embodiments, common mode unit 714 may be employed to adjust a DC operating level of clock signal 711. Common mode unit 714 may include a voltage regulator unit, an adjustable DC voltage source, or any other suitable circuit capable of providing a desired voltage level.

Although only one inductor and capacitor are depicted in filter 700, it is noted that, in other embodiments, any suitable number of capacitors and inductors, and any suitable arrangement of capacitors and inductors, may be employed.

Figure 8:
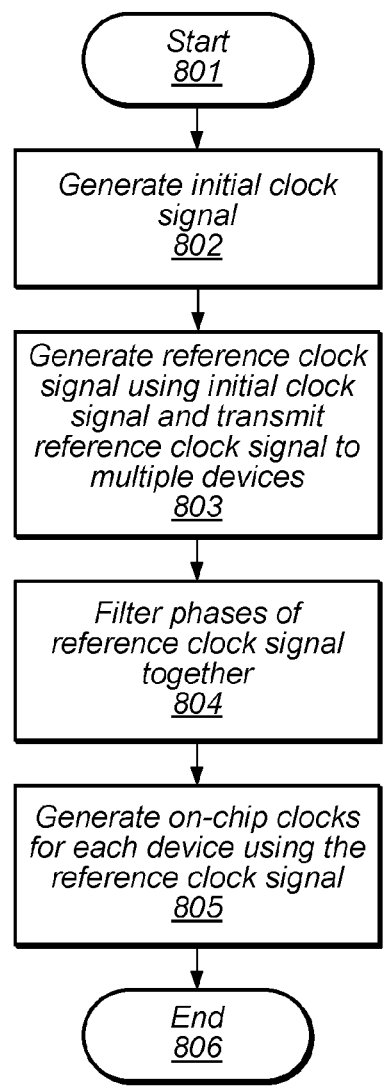
FIG. 8 depicts a flow diagram illustrating an embodiment of a method generating a shared reference clock signal.

A flow diagram depicting an embodiment of a method for generating a shared reference clock is illustrated in FIG. 8. Referring collectively to FIG. 1, and the flow diagram of FIG. 8, the method begins in block 801. Device 101 then generates an initial, or source, clock signal (block 802). In various embodiments, reference clock generator unit 106 may employ a crystal oscillator, such as, e.g., crystal oscillator 201 as illustrated in FIG. 2 to generate an initial clock signal. In other embodiments, reference clock generator unit 106 may employ any suitable oscillator circuit.

Reference clock generator unit 106 may then generate a reference clock signal using the initial clock signal and transmit the reference clock signal to multiple devices such as, devices 102a and 102b of FIG. 1, for example (block 803). The reference clock signal may include phases 105 and 106 that are inverses of each other. In some embodiments, reference clock generator 106 may employ a PLL, such as, e.g., PLL 203 as illustrated in FIG. 2, to create an intermediate clock signal dependent upon the initial clock signal. A frequency of the intermediate clock signal may be substantially the same as the initial clocks signal. In some cases, the frequency of the intermediate clock signal may be higher or lower than the frequency of the initial clock signal.

The multiple devices may be coupled to device 101 by metal wiring traces on a circuit board, ceramic substrate, or other suitable material or package for mounting and connecting integrated circuits. In some embodiments, one or more power supply (or ground) wires may be placed next to or between wires corresponding the phases of the reference clock. Such power supply wires (commonly referred to as "shields") may, in various embodiments, reduce an amount of noise coupled into the reference clock phases from nearby signals.

Phases 105 and 106 of the reference clock signal may then be filtered (block 804). A filter unit, such as, e.g., filter unit 400 as illustrated in FIG. 4, may be coupled between the phases of the reference clock signal while, in other embodiments, each phase of the reference clock signal may be separately filtered as illustrated in FIG. 6. In some embodiments, the filter unit may include a combination of capacitors and inductors. Such passive components may, in various embodiments, be discrete components, separate from device 101. Alternatively, or additionally, inductors and capacitors may be fabricated on device 101 as part of a semiconductor manufacturing process.

Each device, such as, e.g., device 102, may then generate an internal or local clock, using the received reference clock signal (block 805). Local clock generators 108a and 108b may receive phases 105 and 106 of the reference clock signal. A receiver circuit, such as, e.g., receiver 301 as illustrated in FIG. 3, may be used to amplify a difference in voltage levels between the two phases. The resultant signal may be used in conjunction with other circuits, such as, e.g., a PLL, to generate a clock signal internal a corresponding one of devices 102a and 102b, which maintains a known phase relationship with the reference clock signal. The method may then conclude in block 806.

Although the operations of the embodiment of the method illustrated in FIG. 6 are depicted as being performed in series, in other embodiments, one or more of the operations may be performed in parallel on in a different order.

Although specific embodiments have been described above, these embodiments are not intended to limit the scope of the present disclosure, even where only a single embodiment is described with respect to a particular feature. Examples of features provided in the disclosure are intended to be illustrative rather than restrictive unless stated otherwise. The above description is intended to cover such alternatives, modifications, and equivalents as would be apparent to a person skilled in the art having the benefit of this disclosure.

The scope of the present disclosure includes any feature or combination of features disclosed herein (either explicitly or implicitly), or any generalization thereof, whether or not it mitigates any or all of the problems addressed herein. Accordingly, new claims may be formulated during prosecution of this application (or an application claiming priority thereto) to any such combination of features. In particular, with reference to the appended claims, features from dependent claims may be combined with those of the independent claims and features from respective independent claims may be combined in any appropriate manner and not merely in the specific combinations enumerated in the appended claims

What is claimed is:

1. An apparatus, comprising:
   a phase-locked loop (PLL) configured to generate a source clock signal;
   a buffer configured to generate a first reference clock signal and a second reference clock signal dependent upon the source clock signal, wherein a second phase of the second reference clock signal is an inverse of a first phase of the first reference clock signal; and
   a filter configured to filter the reference clock signal, wherein the filter includes at least one capacitor and at least one inductor, and wherein the at least one capacitor and the at least one inductor are coupled, in parallel, between the first reference clock signal and the second reference clock signal.

2. The apparatus of claim 1, further comprising an interface unit configured to transmit data via a communication link to at least one destination device of a plurality of destination devices dependent upon the first and second reference clock signals.

3. The apparatus of claim 2, wherein the communication link comprises a Peripheral Component Interface Express (PCIe) interface.

4. The apparatus of claim 1, wherein the filter includes a first filter coupled to the first phase and a second filter coupled to the second phase, wherein the first filter includes a first inductor coupled in series with the first reference clock signal and a first capacitor coupled between the first reference clock signal and a circuit node at ground potential, and wherein the second filter includes a second inductor coupled in series with the second reference clock signal and a second capacitor coupled between the second reference clock signal and the circuit node at ground potential.

5. The apparatus of claim 1, further comprising a crystal oscillator circuit, and wherein the PLL is further configured to generate the source clock signal dependent upon an output signal from the crystal oscillator circuit.

6. A method, comprising:
generating a first reference clock signal and a second reference clock signal by a source device, wherein a second phase of the second reference clock signal is an inverse of a first phase of the first reference clock signal;
filtering the reference clock signal using a filter unit wherein the filter unit includes at least one capacitor and at least one inductor, and
wherein the at least one capacitor and the at least one inductor are coupled, in parallel between the first reference clock signal and the second reference clock signal;
transmitting data via a communication link by the source device;
receiving the first and second reference clock signals by a given destination device of a plurality of destination devices; and
receiving, via the communication link, the data by the given destination device of a plurality of destination devices dependent upon the first and second reference clock signals.

7. The method of claim 6, wherein the at least one inductor includes one or more metal wires included in the source device.

8. The method of claim 6, further comprising generating, by a phase-locked loop (PLL), a source clock signal, and wherein generating the first and second reference clock signals includes generating the first and second reference clock signals dependent upon the source clock signal.

9. The method of claim 6, wherein receiving the first and second reference clock signals by the given destination device includes generating an internal clock signal dependent upon the first and second reference clock signals.

10. The method of claim 9, wherein to receiving, via the communication link, the data by the given destination device includes sampling the data dependent upon the internal clock signal.

11. The method of claim 6, wherein the communication link comprises a Peripheral Component Interface Express (PCIe) interface.

12. A system, comprising:
a source device configured to:
generate a first reference clock signal and a second reference clock signal, wherein a second phase of the second reference clock signal is an inverse of a first phase of the first reference clock signal; and
transmit data via a communication link;
a filter unit coupled between the first reference clock signal and the second reference clock signal;
wherein the filter unit includes at least one capacitor and at least one inductor, and wherein the at least one capacitor and the at least one inductor are coupled, in parallel, between the first reference clock signal and the second reference clock signal; and
a plurality of destination devices, wherein each destination device of the plurality of destination devices is configured to:
receive the first and second reference clock signals; and
receive the data, via the communication link, dependent upon the first and second reference clock signals.

13. The system of claim 12, wherein the at least one inductor includes one or more metal wires included in the source device.

14. The system of claim 12, wherein the source device includes a phase-locked loop (PLL) configured to generate a source clock signal, and wherein to generate the first and second reference clock signals, the source device is further configured to generate the first and second reference clock signals dependent upon the source clock signal.

15. The system of claim 12, wherein to receive the first and second reference clock signals, each destination device of the plurality of destination devices is further configured to generate a respective internal clock signal dependent upon the first and second reference clock signals.

16. The system of claim 12, wherein to receive the data, via the communication link, each destination device of the plurality of destination devices is further configured to sample the data dependent upon the respective internal clock signal.

17. The system of claim 12, wherein the communication link comprises a Peripheral Component Interface Express (PCIe) interface.

* * * * *